(12) United States Patent
Bryan

(10) Patent No.: US 8,837,745 B2
(45) Date of Patent: Sep. 16, 2014

(54) ELECTRO-ACOUSTIC AUDIO REVERBERATION DEVICE AND METHOD

(75) Inventor: Leonard C. Bryan, Palm Beach Gardens, FL (US)

(73) Assignee: Ecolivegreen Corp., Coral Springs, FL (US)

( * ) Notice: Subject to any disclaimer, the term of this patent is extended or adjusted under 35 U.S.C. 154(b) by 674 days.

(21) Appl. No.: 13/182,323

(22) Filed: Jul. 13, 2011

(65) Prior Publication Data

US 2013/0016845 A1   Jan. 17, 2013

(51) Int. Cl.
*H03G 3/00* (2006.01)
*G10H 1/00* (2006.01)

(52) U.S. Cl.
CPC .................... *G10H 1/0091* (2013.01)
USPC .............................................. 381/63; 84/622

(58) Field of Classification Search
CPC ..... G10H 1/00; G10H 1/0058; G10H 1/0091; G10H 1/366; G10H 2220/521; G10H 2230/095; G10H 2230/101; G10H 2230/115; G10H 2230/145; G10H 2230/271; G10H 2250/455
USPC ........... 381/61–64, 56, 58, 98, 92, 66, 84, 85; 84/615, 622, 630, 701, 707, 26; 700/94
See application file for complete search history.

(56) References Cited

U.S. PATENT DOCUMENTS

| | | | |
|---|---|---|---|
| 2,318,417 A | 5/1943 | Phelps | |
| 2,421,424 A | 6/1947 | Kreuzer | |
| 2,923,369 A | 2/1960 | Kuhl | |
| 2,986,228 A | 5/1961 | Rettinger et al. | |
| 3,136,853 A * | 6/1964 | Bissonette et al. | 381/65 |
| 3,189,686 A | 6/1965 | Brombaugh | |
| 3,246,264 A | 4/1966 | Brombaugh et al. | |
| 3,267,197 A | 8/1966 | Hurvitz | |
| 3,267,198 A | 8/1966 | Hurvitz | |
| 3,316,496 A | 4/1967 | Brombaugh | |
| 3,719,905 A | 3/1973 | Kuhl et al. | |
| 4,215,242 A * | 7/1980 | Gross | 381/63 |
| 5,565,641 A * | 10/1996 | Gruenbaum | 84/615 |
| 7,257,230 B2 * | 8/2007 | Nagatani | 381/56 |
| 7,309,829 B1 * | 12/2007 | Ludwig | 84/622 |
| 8,294,016 B2 * | 10/2012 | Franzblau | 84/609 |
| 2001/0012238 A1 | 8/2001 | Iwasaki et al. | |
| 2005/0216211 A1 | 9/2005 | Nagatani | |

FOREIGN PATENT DOCUMENTS

GB   1006946 A   10/1965

OTHER PUBLICATIONS

Instruction Manual EMT 240 Reverb Foil, Publisher: Barco—EMT, Germany, Jul. 1977.
Operating Instructions EMT 162ST (EMT-140), publication date unknown.

(Continued)

*Primary Examiner* — Lun-See Lao
(74) *Attorney, Agent, or Firm* — Stone Creek Services LLC; Alan M. Flum

(57) ABSTRACT

Disclosed is an audio reverberation apparatus. The audio reverberation apparatus interacts with or may include a mechanical or acoustic reverberation element. An audio signal is pitch transposing upward and applied to the mechanical or acoustic reverberation element. The resulting audio reverberant signal retrieved from the mechanical or acoustic reverberation element is pitch-transposed downward by the same factor as the upward pitch transposing. This results in the mechanical or acoustic reverberation element requiring smaller dimensions in comparison to a mechanical or acoustic reverberation element where a non-pitch-transposed audio signal is applied.

19 Claims, 11 Drawing Sheets

(56) References Cited

OTHER PUBLICATIONS

Tilting at Windmills aka DIY Plate Reverb, publication date: unknown, Beavis Audio Research, website: http://www.beavisaudio.com/Projects/Plate_Reverb/.

Bob Buontempo, How to Build Your Own Plate Reverb: A Concise Step By Step Process, Date of Publication: Feb. 10, 2011 (early known publication date: Aug. 24, 2009) ProSoundWeb, website: http://www.prosoundweb.com/article/how_to_build_your_own_plate_reverb.

\* cited by examiner

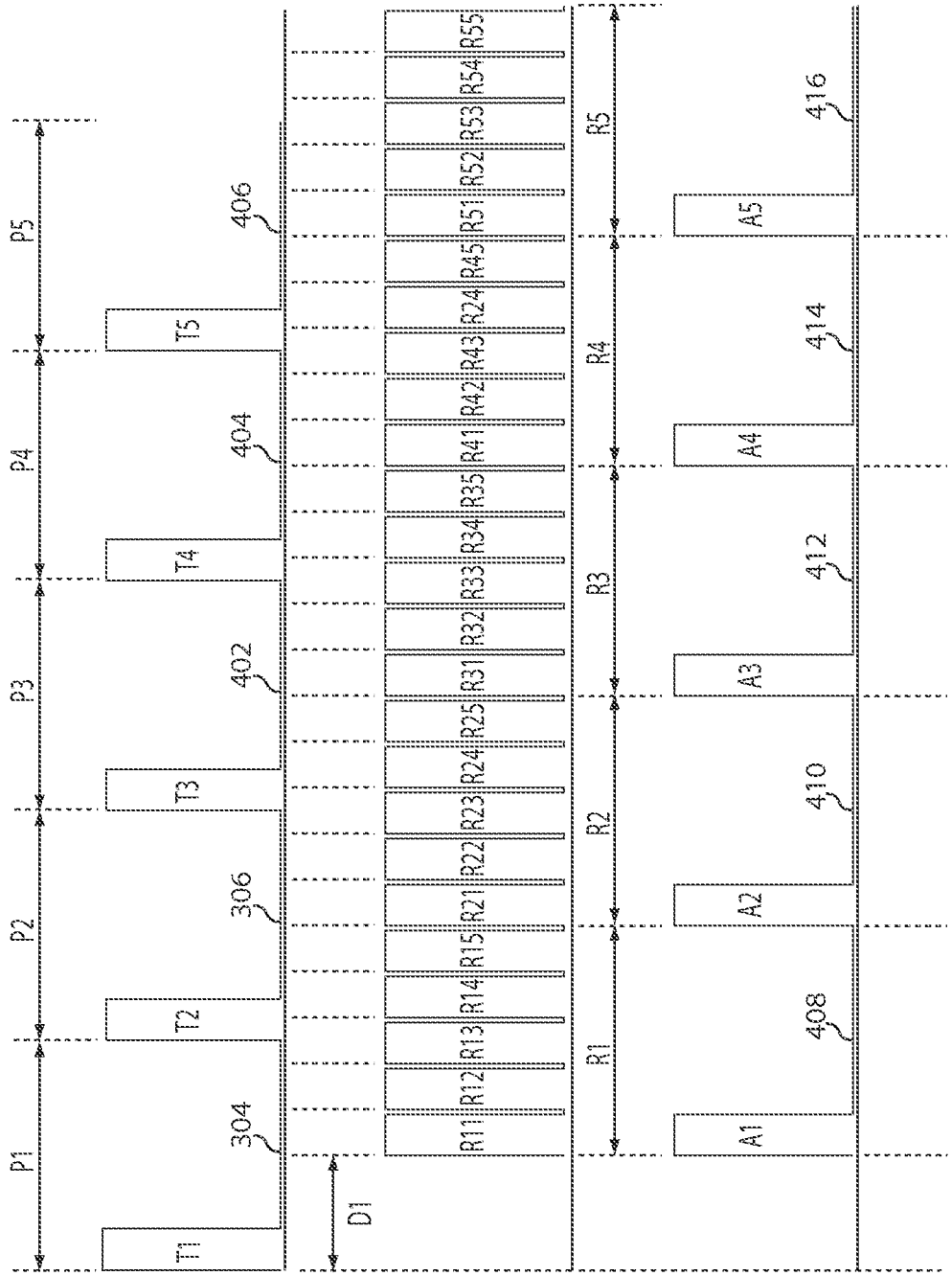

ELECTRO-ACOUSTIC AUDIO REVERBERATION DEVICE AND METHOD

BACKGROUND

This application is related to the field of electrical audio signal processing devices, specifically to audio reverberators.

Audio reverberation devices (reverbs) were originally designed to simulate the rich sound produced by concert hall or other acoustically pleasant environments. Today, reverbs are used to add sonic texture and richness to vocals, acoustic instruments, and electronic music producing devices. Reverbs are typically used in audio production for music, film, and video.

Before the advent of modern digital processing hardware and software, early reverbs were either acoustic or electro-mechanical. For example, large suspended metal plates, often as large as 1 m×3 m and weighing as much as 300 kg were used create a pleasant and somewhat realistic reverberant field. These are known as plate reverbs. While often less realistic, suspended metal springs where used to create an economical reverb device. These are known as spring reverbs. Alternatively, acoustic chambers where constructed in an attempt to create a rich sounding and realistic reverberant field. These included a dedicated room with a set of speakers to project sound into the room and one or more microphones to pickup the resultant reverberant field. These devices are referred to as acoustic reverb chambers.

Modern reverbs generally use digital signal processing algorithms to create the reverberation effect. The algorithm used to produce the reverberation effect can reside in a standalone audio processing device. Alternatively, it can be implemented in software for use within a personal computer. In either case, modern reverb algorithms are often capable of producing realistic simulations of various concert halls and other rooms, classical spring and plate reverbs, as well as imaginary spaces.

In spite of the advantages of digital reverberation devices described in the previous paragraph, classic electro-acoustic reverberation devices, such as plate reverbs or acoustic chambers, are often valued for the sound they produce and classical electro-acoustic reverberations devices are often prized over modern digital reverberation devices. However, one of the disadvantages of classic electro-acoustic reverberation devices is their physical size, which often is large. This limits their use.

SUMMARY

This Summary introduces a selection of concepts in simplified form that are described the Description. The Summary is not intended to identify essential features or limit the scope of the claimed subject matter.

Apparatus and methods disclosed have the possibility of overcoming the problem of large physical size of electro-acoustic reverberation devices by pitch transposing upward an audio signal applied to an acoustic reverberation element and then reciprocally pitch-transposed downward the resulting audio signal retrieved from the acoustic reverberation element. This results in a mechanical or acoustic reverberant structure that has smaller dimensions.

In one aspect, the audio signal is separated into a plurality of portions before it is upwardly pitch-transposed. Pitch transposing shortens the duration and increases the pitch of the audio signal. This change in duration is proportional to the pitch transpose ratio. Because the duration is shortened, the resulting pitch-transposed portions have a sub-portion that includes the pitch-transposed audio signal and sub-portions without the audio signal for the remaining duration of the portion.

The pitch-transposed portions are applied to the acoustic reverberation element. A plurality of resultant reverberant portions is received from the acoustic reverberation element. Each resultant reverberant portion may contain reverberation during some or all of the sub-portions that originally were without the pitch-transposed audio signal.

Sub-portions within each resultant reverberant portion are successively arranged into successive portions in order to create a proper time sequence. The temporally arranged portions are pitch-transposed downward by a reciprocal factor with respect to the upwardly pitch transposing.

DRAWINGS

Figure 2:
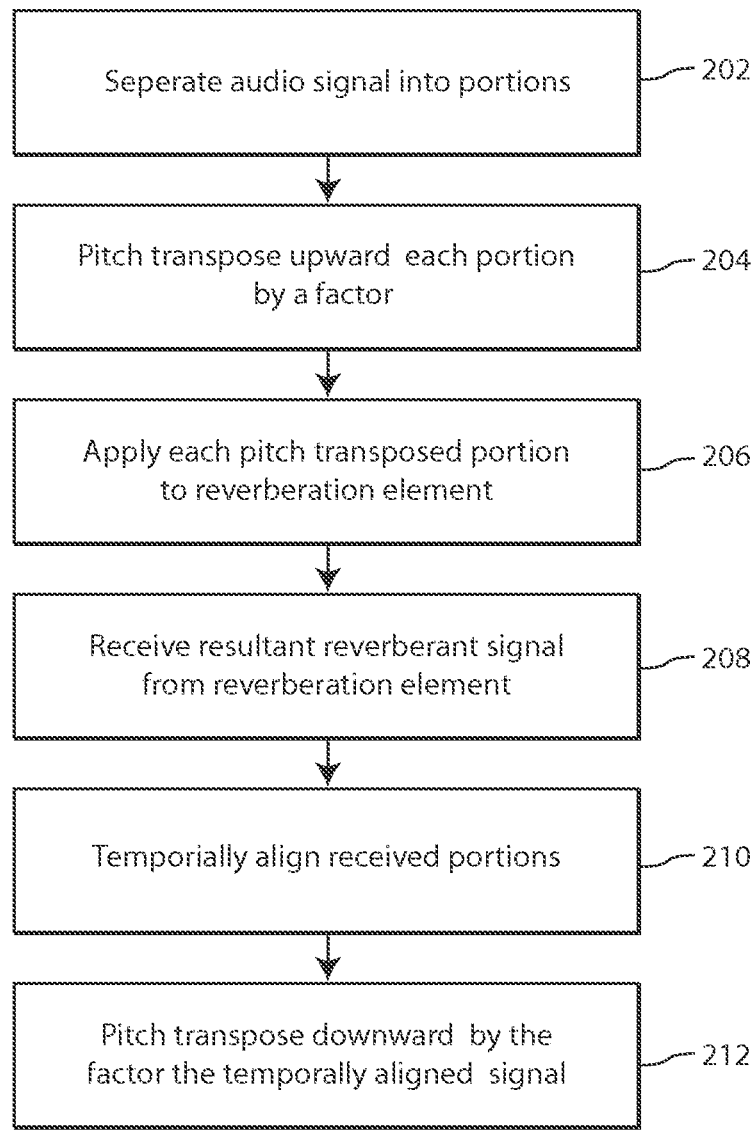
FIG. 2 illustrates an alternative flow chart in accordance with the principles of the invention.

FIGS. 3A, 3B, 3C, and 3D show signal flow timing diagrams in accordance with FIG. 2.

FIGS. 4A, 4B, and 4C show signal flow timing diagrams in accordance with FIG. 3.

Figure 5:
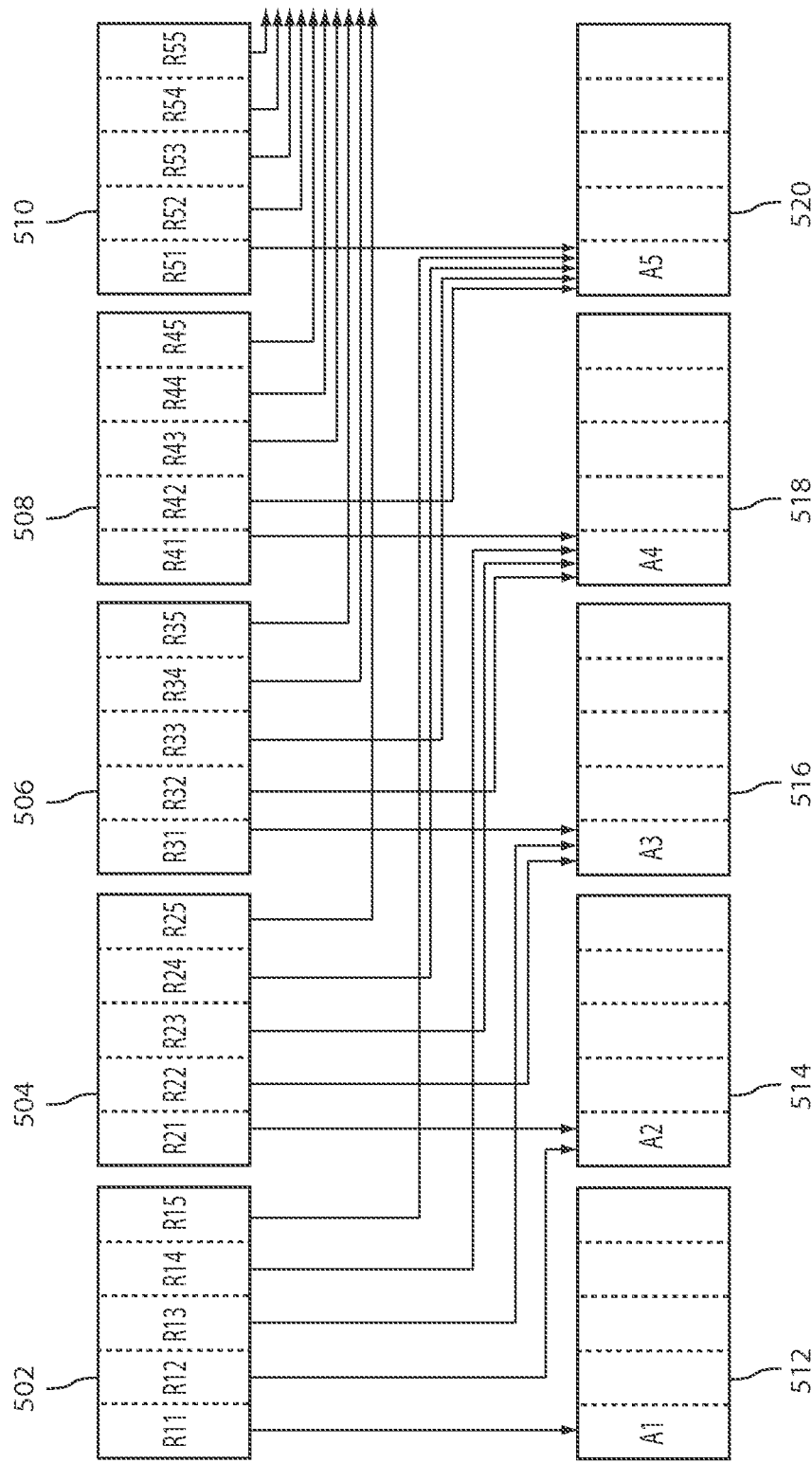

FIG. 5 illustrates a flow chart showing an example of temporally arranging successive reverberant portions.

Figure 6:
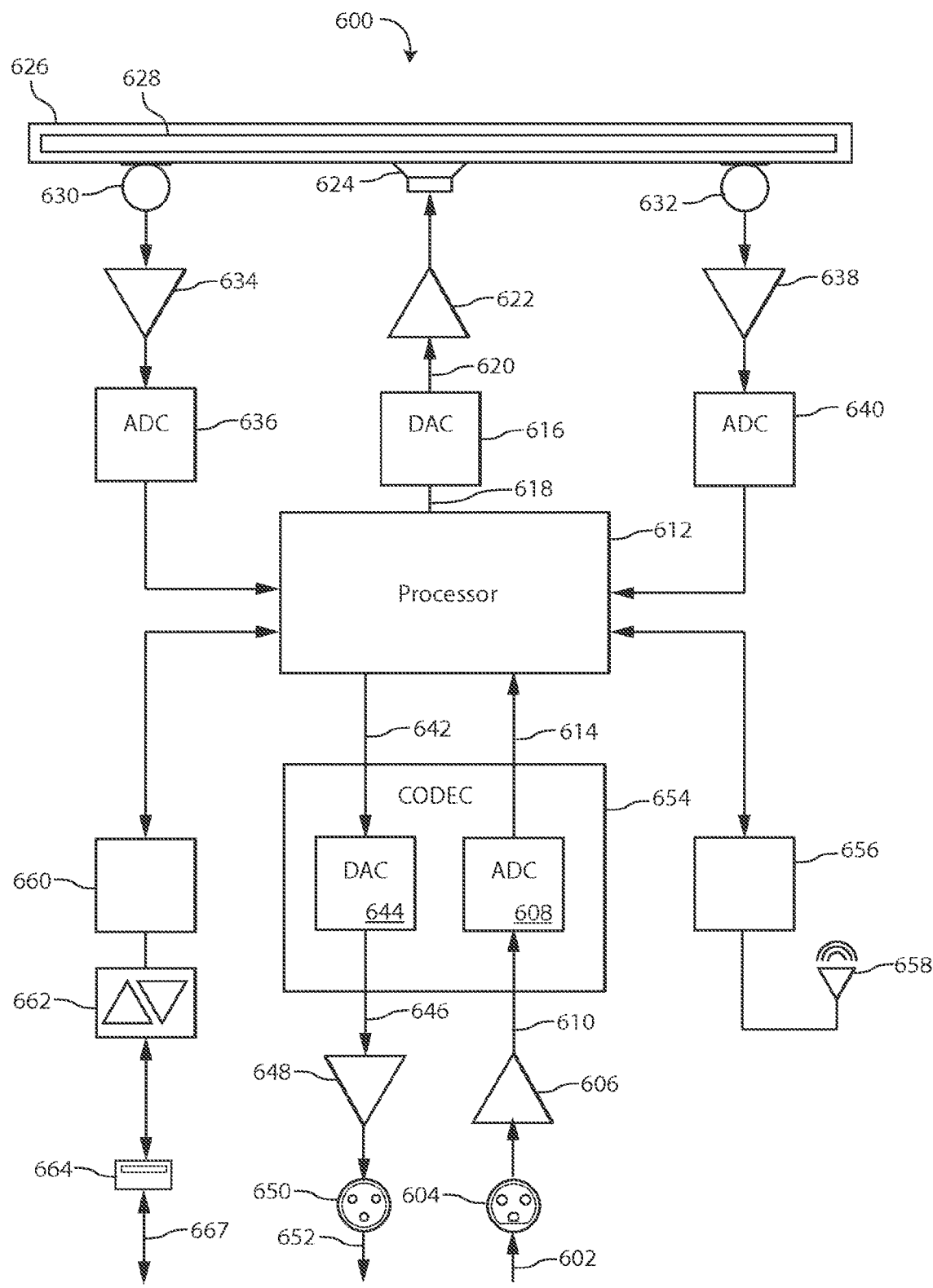

FIG. 6 shows a block diagram of an apparatus in accordance with principles of the invention.

Figure 7B:
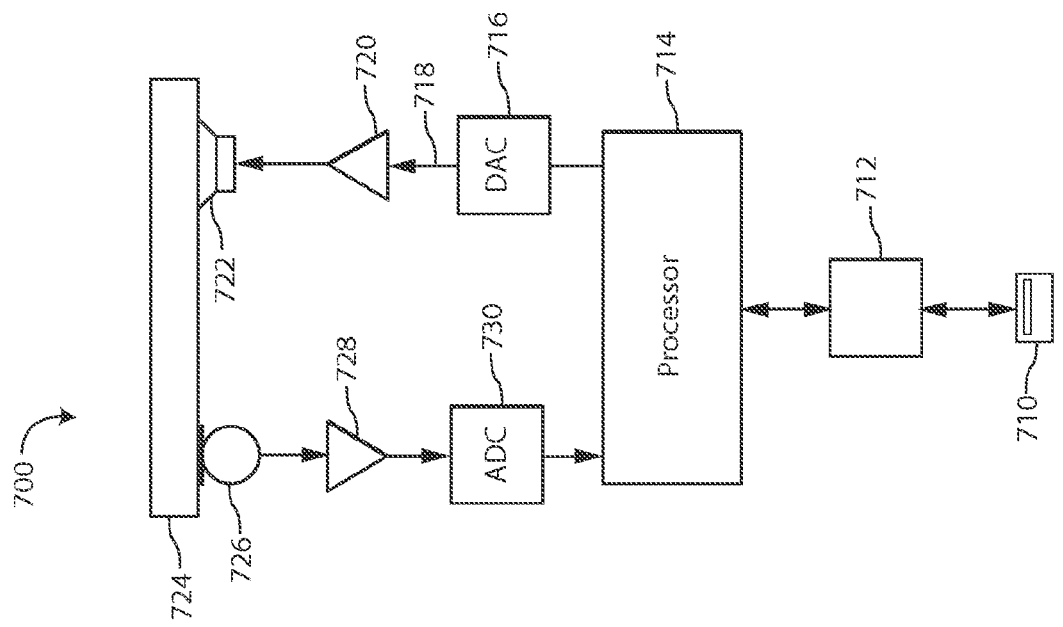
Figure 7A:
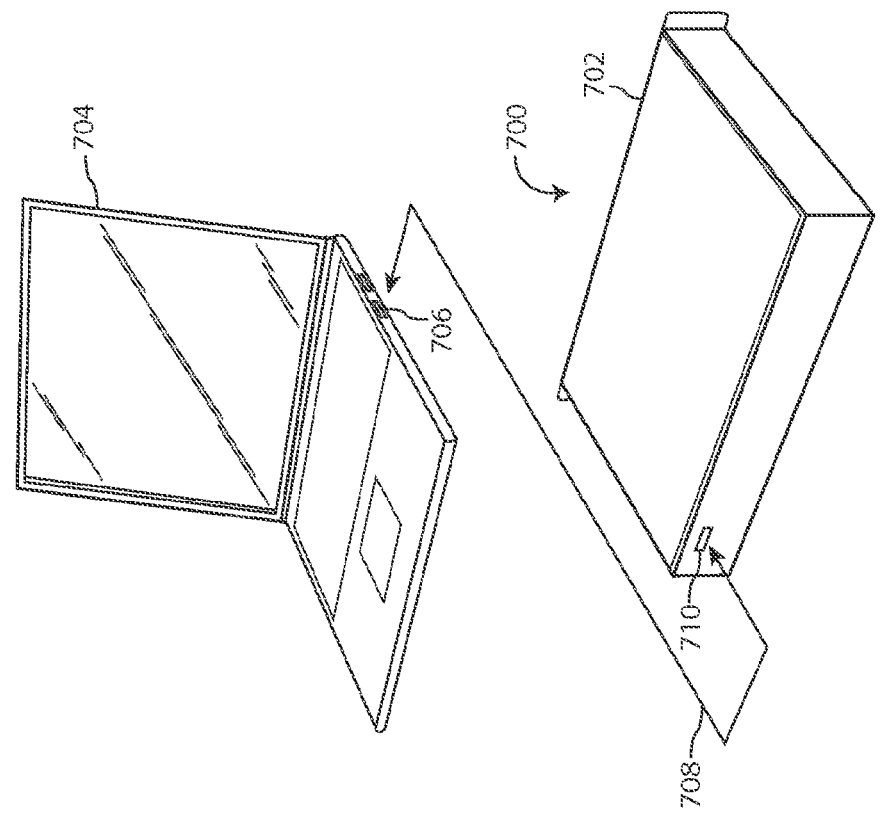

FIG. 7A shows a personal computer for the upward and downward pitch transposing in communication with an enclosed apparatus, the apparatus including a reverberation element and means for applying a resultant pitch-transposed audio signal to the acoustic reverberation element, and means for receiving a resultant reverberant signal from the acoustic reverberation element.

FIG. 7B shows a block diagram of the enclosed apparatus of FIG. 7A.

Figure 8:
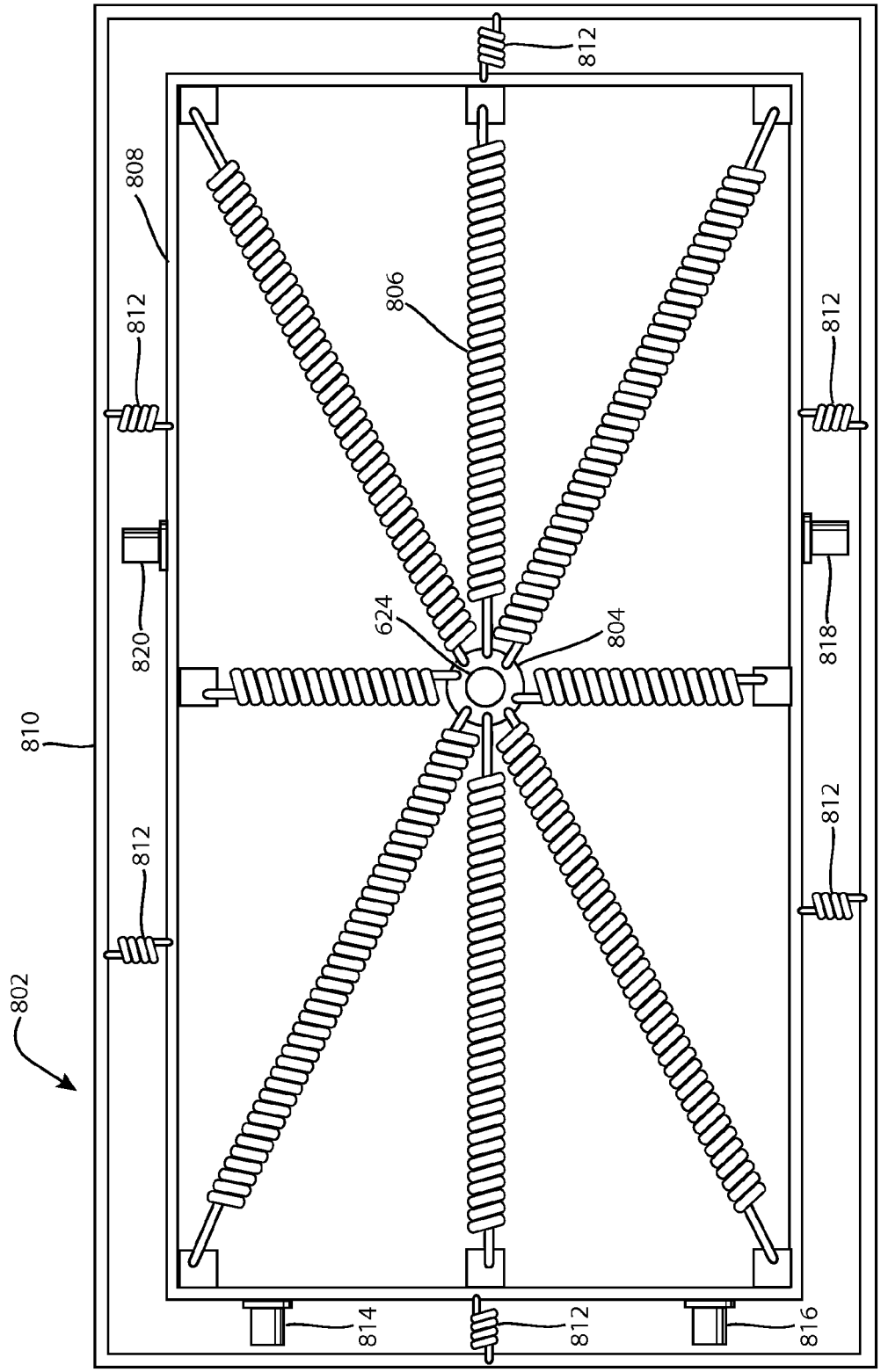

FIG. 8 shows a typical spring reverb suitable as an acoustic reverberation element.

Figure 9:
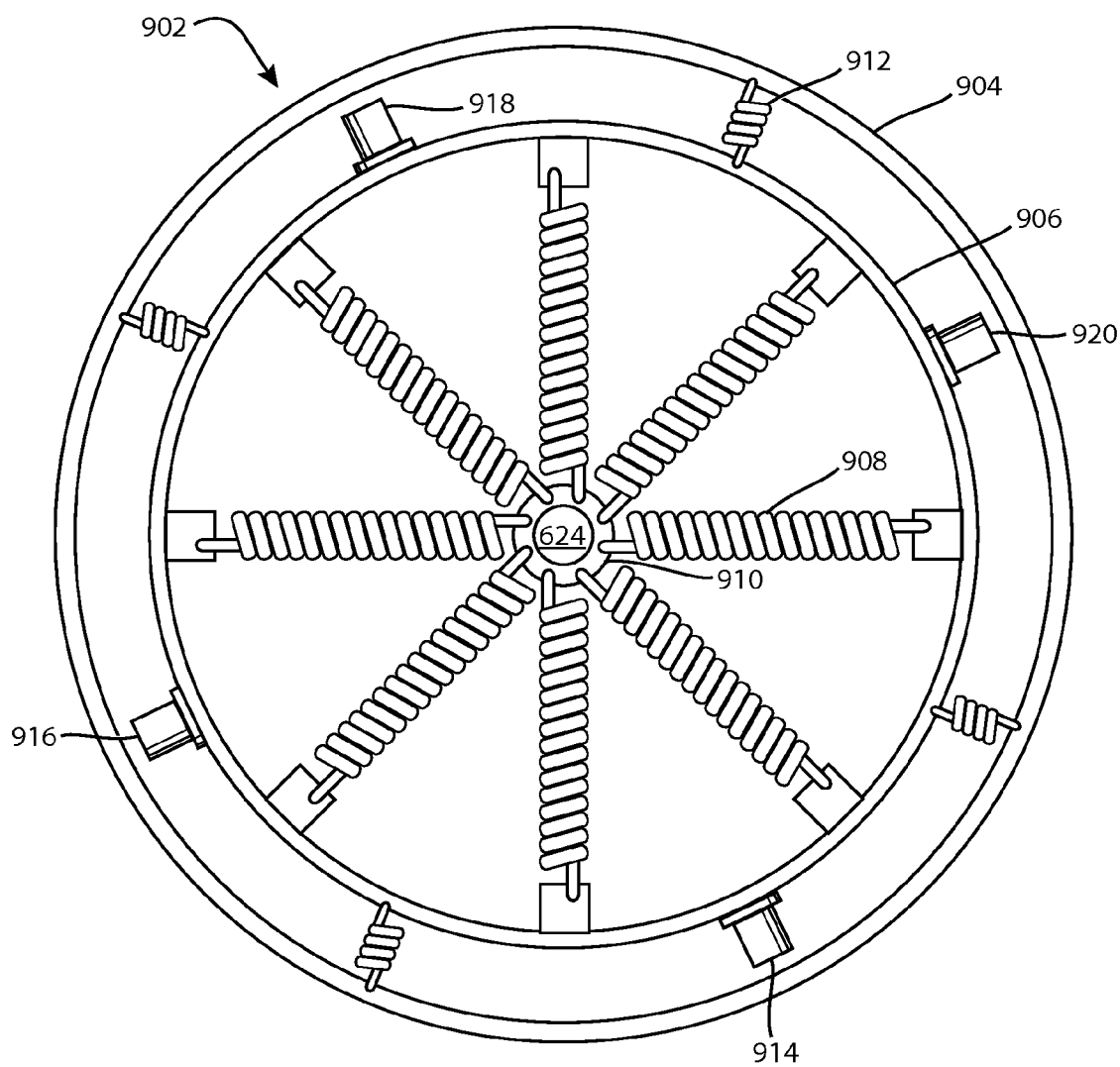

FIG. 9 shows an alternative spring reverb suitable as an acoustic reverberation element.

Figure 10:
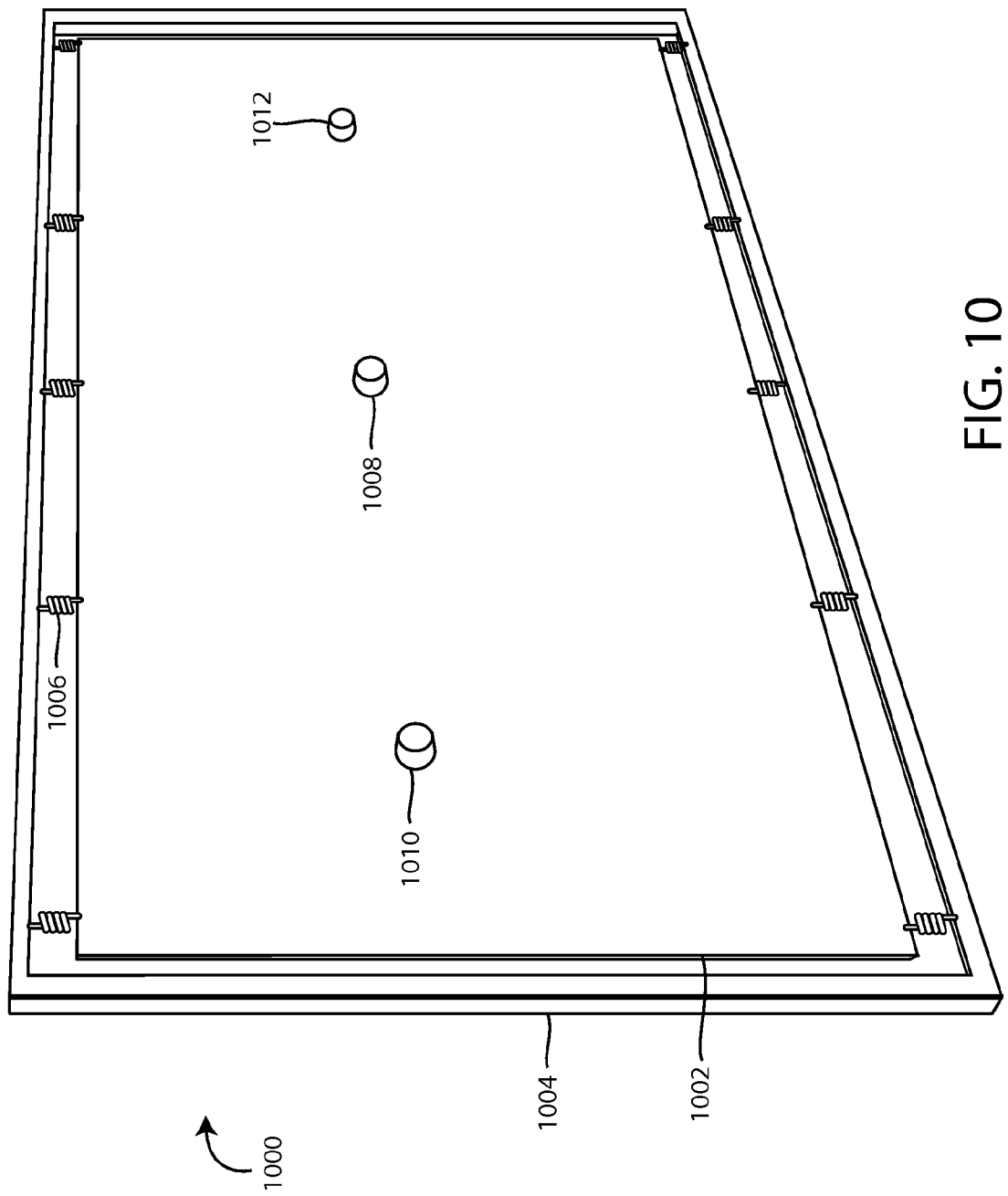

FIG. 10 shows a plate reverb device suitable as an acoustic reverberation element.

Figure 11:
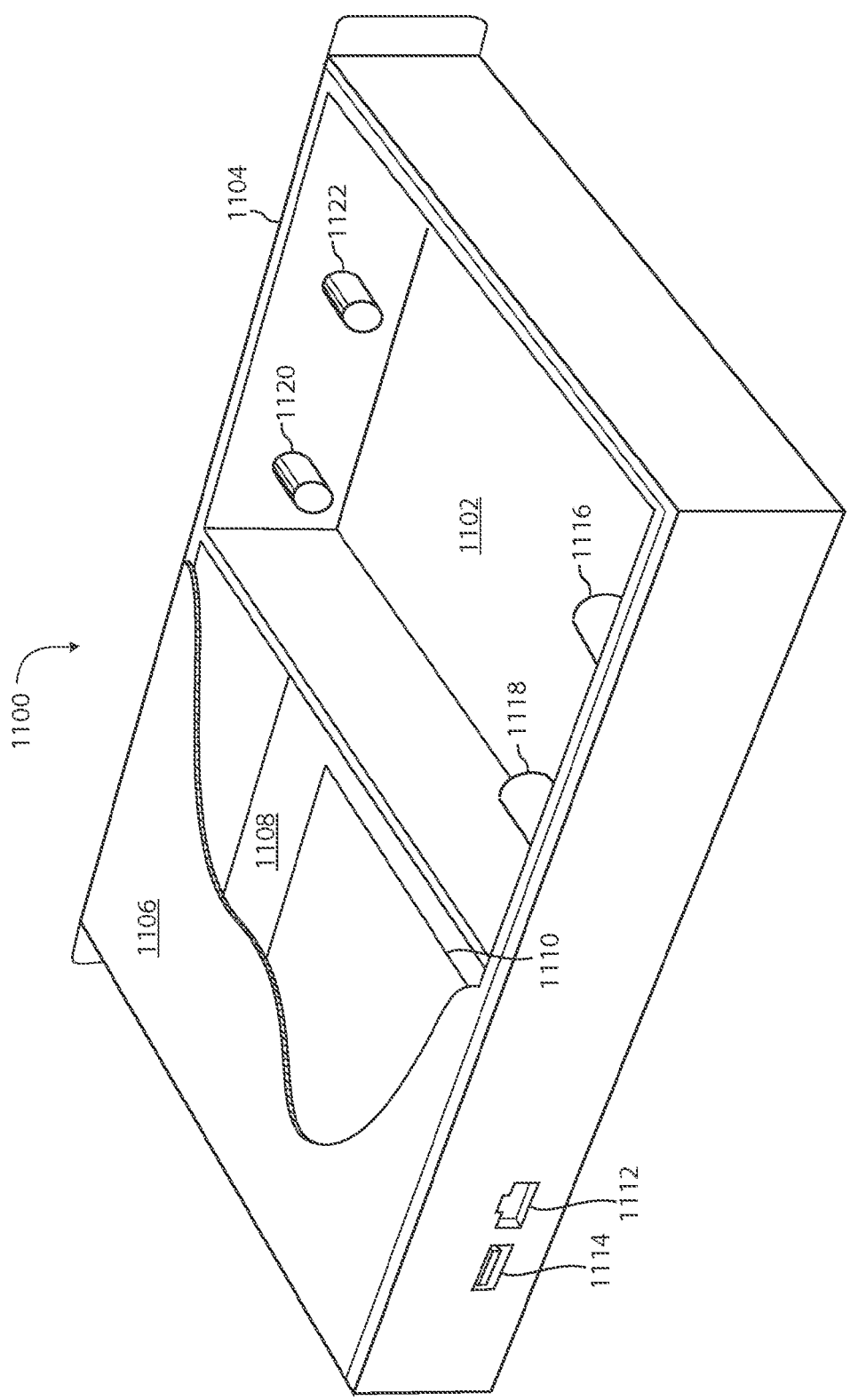

FIG. 11 shows a partial cutaway view of an enclosed apparatus that includes an acoustic reverb chamber suitable as acoustic reverberation element.

DESCRIPTION

The following terms are used throughout this disclosure and are defined here for clarity and convenience.

Acoustic: As used in this disclosure, the term "acoustic" is used as a modifier to mean something capable of carrying, modifying, or controlling mechanical vibrations in a solid, liquid, or gaseous medium where the mechanical vibrations travel at or near the speed of sound. These mechanical vibrations may include frequencies in the sonic (audible) frequency range and ultra-sonic frequency ranges.

Acoustic Medium: As used in this disclosure, an "acoustic medium" refers to a solid, liquid, or gaseous medium capable of carrying mechanical vibration at or near the speed of sound within that medium.

Acoustic Driver: As used in this disclosure, an "acoustic driver" refers to a device, or combination of devices, capable of converting an electrical signal to mechanical vibration. The mechanical vibration may include sonic or ultra-sonic frequencies depending on the construction of the driver or combination of drivers.

Acoustic Transducer: As used in this disclosure, an "acoustic transducer" refers to a device, or combination of devices, capable of converting mechanical vibration into an electrical signal. The mechanical vibration may include sonic or ultrasonic frequencies depending on the construction of the acoustic transducer.

Pitch Transpose: As used in this disclosure, "pitch transpose", "pitch transposing", or "pitch transposition" means changing the pitch of a sound that also results in a change of its duration. This is analogous to speeding up or slowing down a tape recorder where the speed, or pitch, of the sound and its duration are affected. This is in contrast to "pitch shifting" where the pitch of a sound is changed without affecting its duration or tempo.

Figure 1:
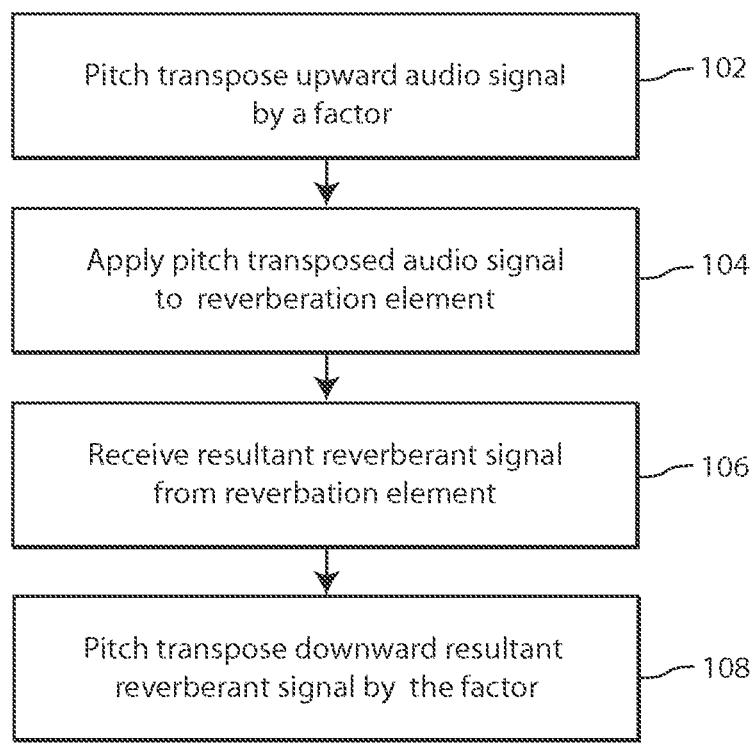
FIG. 1 illustrates a flow chart in accordance with the principles of the invention.

Referring now to the drawings in detail wherein like numerals indicate like elements throughout the several views, FIG. 1 shows a flow chart of a process, in accordance with principles of the invention, for processing audio signals into and out of an acoustic reverberation element. In step 102, a digital audio signal is pitch-transposed upward. The pitch transposition factor can typically be a constant multiplier, for example, a factor of 10, or a factor of 500, but is not limited to these examples. Typically, audio signals have a frequency range between 20 Hz to 20 kHz. Pitching transposing upward the digital audio signal by a factor of 10 would transpose a 20 Hz signal to 200 Hz, and a 20 kHz signal to 200 kHz, making the pitch-transposed audio frequency range 200 Hz to 200 kHz. Similarly, pitch transposing upward by a factor of 500 would transpose a 20 Hz signal to 10 kHz and transpose a 20 kHz signal to 1 MHz, making the pitch-transposed audio frequency range from 10 kHz to 1 MHz. The pitch transposition factor can typically range from 2 to 500, but is not limited to this range.

In step 104, the pitch-transposed audio signal is applied to an acoustic reverberation element. The acoustic reverberation element can be a solid element, for example, a plate reverb or a spring reverb. Alternatively, the acoustic reverberation element can be a liquid or gaseous element, for example, a reverb chamber. The reverberation element can be any medium or element capable of transmitting audio in the pitch-transposed frequency range and creating a resultant simulated reverberant field. The pitch-transposed audio signal can be applied to the reverberation element by converting the pitch-transposed audio signal to an analog signal, typically using a digital-to-analog converter (DAC), pulse width modulator (PWM), or other devices capable of digital to analog conversion, and applying the analog signal to an acoustic driver. The acoustic driver can be a single driver responsive to the pitch-transposed frequency range or a combination of drivers responsive to pitch-transposed frequency range.

In step 106, a resultant reverberant signal is received from the reverberation element. For example, the reverberant signal can be received from a transducer responsive to the pitch-transposed frequency range. The resultant analog reverberant signal can be converted to a digital reverberant signal typically through an analog-to-digital converter (ADC).

In step 108, the resultant digital reverberant signal is pitch-transposed reciprocally downward by the same factor as the original pitch transposition factor. For example, if the original upward pitch transposition factor were a factor of 10, then in step 110, the resultant digital reverberant signal is downwardly pitch-transposed by the same factor of 10. Because the upward and downward pitch transpositions are reciprocal processes, this results in a reverberant signal representative of the original audio frequencies.

The signal of step 110 can be output as either an analog, digital, or digitally streamed signal, or stored for further processing. For example, the signal can output in analog format through a DAC or similar device. In another aspect, the signal can be output through digital audio connectors using a processing device for producing digital audio protocol. In another aspect, the signal can be output using digital computer protocol using a processing device for producing digital computer protocol signals. In yet another aspect, the signal can be streamed digitally into a processor, processor memory, or a storage device such as a hard drive or flash memory for further processing.

FIG. 2 illustrates a flow chart showing an alternative method in accordance with principles of the invention. Referring to FIG. 2, in step 202, a digital audio signal is separated into portions. The length of each portion is arbitrary.

In step 204, each portion is pitch-transposed by a factor. A typical range for the pitch transposition factor is 2 to 500, however the pitch transpose factor is not limited to this range. The step of pitch transposition and the step of separating the signal into portions can be accomplished, for example, by loading a plurality of audio samples of the digital audio signal into a memory buffer and shifting out the samples at a rate equal to the pitch transpose factor. The resultant portion is equal to the number of samples loaded into buffer memory. Because the resultant pitch-transposed signal is shifted out of the memory buffer at a much higher rate than the samples arrived, the resultant portion includes a sub-portion with the pitch-transposed samples and a gap period without samples. For example, if the samples are pitch-transposed by a factor of 10, then resultant pitch-transposed signal will contain a sub-portion equal to 0.1 the length of the original portion, and a gap period equal to 0.9 the length of the original portion.

In step 206, each pitch-transposed portion is applied in sequence, to a reverberation element. As previously described, the acoustic reverberation element can be a solid element, for example, a plate reverb or a spring reverb. Alternatively, the acoustic reverberation element can be a liquid or gaseous element, for example, a reverb chamber. The reverberation element can be any medium or element capable of transmitting audio in the pitch-transposed frequency range and creating a resultant simulated reverberant field. The pitch-transposed audio signal can be applied to the reverberation element by converting the pitch-transposed audio signal to an analog signal and applying the analog signal to an acoustic driver. The acoustic driver can be a single driver responsive to the pitch-transposed frequency range or a combination of drivers responsive to pitch-transposed frequency range.

In step 208, a resultant reverberant signal is received from the reverberant element. For example, the reverberant signal can be received from a transducer responsive to the pitch-transposed frequency range. The resultant analog reverberant signal can be converted to a digital reverberant signal typically through an ADC.

The resultant reverberant signal will include reverberant signals during some or all of the gap period of the pitch-transposed signal of step 204. In step 210, the samples are put in proper time sequence or temporarily aligned. In one aspect, each portion is divided into sub-portions equal in length to the sub-portion of the pitch-transposed signal of step 204. Each successive sub-portion after the first sub-portion, within a given portion, is moved and added to the first sub-portion of each subsequent portion. With the successive sub-portions moved, the resultant temporally aligned portions include a first sub-portion and a gap period in place of the moved successive sub-portions.

In step 212, each temporally aligned signal is downwardly pitch transposed by the same factor as the original pitch transposition. In one aspect, each temporally aligned portion is loaded into the buffer memory or an equivalent set of memory registers used to temporally store and shift out audio samples. The samples are shifted out of the buffer memory at a rate that is the reciprocal of rate of the samples shifted out of the buffer memory in step 204. In other words, the pitch is transposed downward by the same factor it is transposed upward. For example, if the samples in step 204 are shifted out at a rate of 10 times faster than they were received, than the samples in step 212 are shifted out of the buffer memory at a rate of 0.1, or 10 times slower, than the samples came in.

Because the downward pitch transposition factor of step 212 is equal to the upward pitch transposition factor of step 204, the samples of step 212 are expanded to their original portion and the resultant signal is no longer pitch-transposed.

The signal of step 212 can output either analog, digital, or digitally streamed or stored for further processing. For example, the signal can output into analog format through a DAC. In another aspect, the signal output format can be a digital audio protocol signal using a processing device for producing digital audio protocol. In another aspect, the signal can be output using digital computer protocol using a processing device for producing digital computer protocol signals. In yet another aspect, the signal can be streamed digitally into a processor, processor memory, or a storage device such as a hard drive or flash memory for further processing.

Figures 3A, 3B, 3C, 3D:
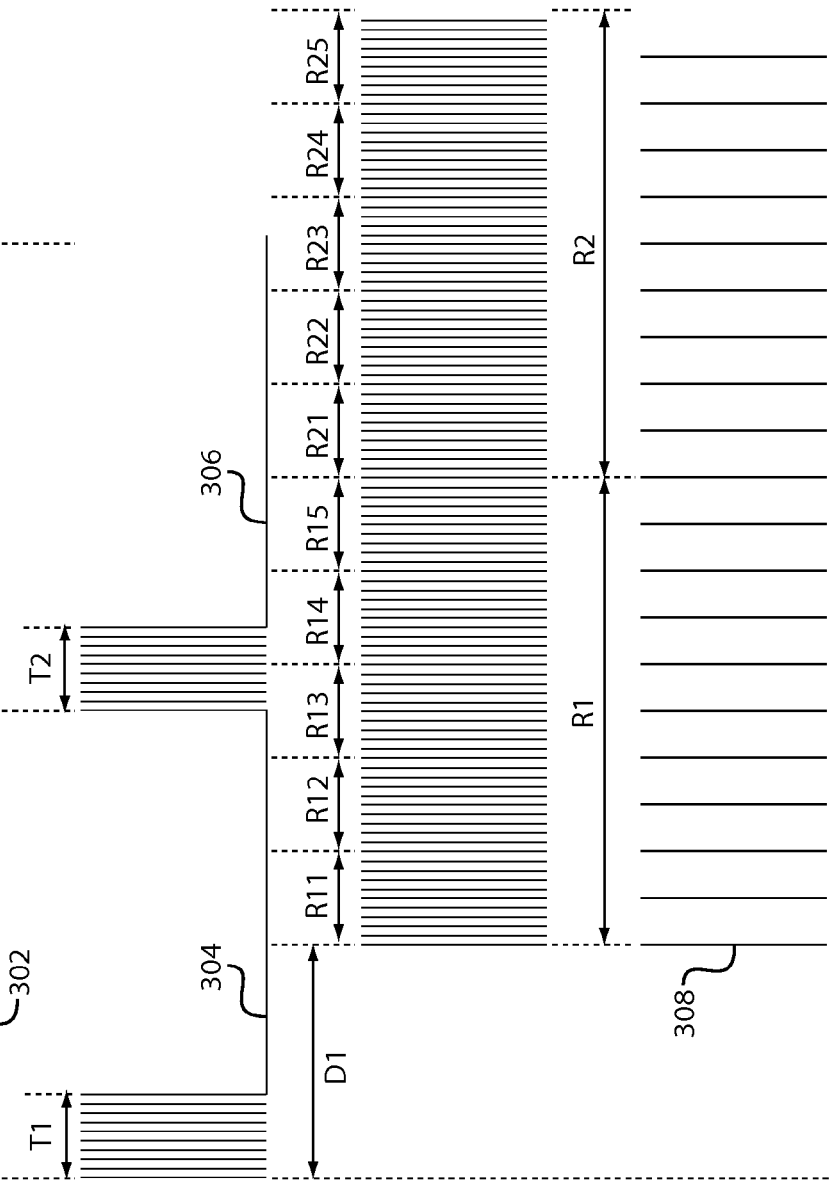

FIGS. 3A, 3B, 3C, and 3D is illustrative of a signal flow diagram in accordance with FIG. 2. This diagram is shown here for illustrative and conceptual purposes and is not representative of actual digital audio signals. For the purpose of illustration and example, the pitch transposition factor of FIGS. 3A, 3B, 3C, and 3D is 5. FIG. 3A, shows an individual audio sample 302 represented diagrammatically by lines. A plurality of the individual audio samples 302 is divided into a first portion P1 and a second portion P2. FIG. 3B shows resultant pitch-transposed audio signals T1 of the first portion P1 and resultant pitch-transposed audio signals T2 of the second portion P2. Also shown are a first gap period 304 of the first portion P1 and a second gap period 306 of the second portion P2.

FIG. 3C shows a representation of the resultant reverberation signal received from an acoustic reverberation element. The resulting portions R1 and R2 are delayed in time by a time delay D1. The acoustic reverberation element, and associated electronics for applying and receiving the audio signal to the acoustic reverberation element, can contribute to the time delay D1. In addition, the time delay D1, in one aspect can also be adjusted electronically to create an "early delay" effect common in natural acoustic reverberation. Shown in FIG. 3C are a first sub-portion R11, a second sub-portion R12, a third sub-portion R13, a fourth sub-portion R14, a fifth sub-portion R15 of the first portion R1 and a first sub-portion R21, a second sub-portion R22, a third sub-portion R23, a fourth sub-portion R24, and a fifth sub-portion R25 of the second portion R2. In FIG. 3C, each sub-portion is equal to 0.2 of their respective portions or the reciprocal of the pitch transposition factor.

FIG. 3D shows the resultant downward pitch-transposed and temporally aligned portions. Each resultant individual audio sample 308 is restored to a non-pitch transposed state.

FIGS. 4A, 4B, and 4C show an expanded timing sequence of FIGS. 3B and 3C, and the resultant temporally aligned signal of step 210 of FIG. 2. For illustrative purposes, each portion or sub-portion is represented by a block in FIGS. 4A, 4B, and 4C, instead of individual lines representing individual samples as in FIGS. 3A, 3B, 3C, and 3D. FIG. 4A shows the first pitch-transposed audio signal T1 and the first gap period 304 of the first portion P1 and the second pitch-transposed audio signal T2 and the second gap period 306 of the second portion P2. In addition, FIG. 4A shows the third pitch-transposed audio signal T3 and a third gap period 402 of a third portion P3, a fourth pitch-transposed audio signal T4 and a fourth gap period 404 of a fourth portion P4, and a fifth pitch-transposed signal T5 and a fifth gap period 406 of a fifth portion P5.

FIG. 4B shows the time delay D1, the first sub-portion R11, the second sub-portion R12, the third sub-portion R13, the fourth sub-portion R14, the fifth sub-portion R15 of the first portion R1 and the first sub-portion R21, the second sub-portion R22, the third sub-portion R23, the fourth sub-portion R24, and the fifth sub-portion R25 of the second portion R2 all of FIG. 3C. In addition FIG. 4B shows a first sub-portion R31, a second sub-portion R32, a third sub-portion R33, a fourth sub-portion R34, and a fifth sub-portion R35 of a third portion R3; a first sub-portion R41, a second sub-portion R42, a third sub-portion R43, a fourth sub-portion R44, and a fifth sub-portion R45 of a fourth portion R4; and a first sub-portion R51, a second sub-portion R52, a third sub-portion R53, a fourth sub-portion R54, and a fifth sub-portion R55 of a fifth portion R5.

FIG. 4C shows a timing sequence of the resultant temporally aligned signal of step 210 of FIG. 2. FIG. 4C shows first temporally aligned sub-portion A1 and a first gap period 408 of portion R1, second temporally aligned sub-portion A2 and a second gap period 410 of portion R2, third temporally aligned sub-portion A3 and a third gap period 412 of portion R1, fourth temporally aligned sub-portion A4 and a fourth gap period 414 of portion R4, and a fifth temporally aligned sub-portion A5 and a fifth gap period 416 of a fifth resultant portion R5.

FIG. 5 illustrates a flow chart showing an example of temporally arranging successive reverberant portions. The pre-temporally aligned first portion 502 includes a first sub-portion R11, a second sub-portion R12, a third sub-portion R13, a fourth sub-portion R14 and a fifth sub-portion R15. The pre-temporally aligned second portion 504 includes a first sub-portion R21, a second sub-portion R22, a third sub-portion R23, a fourth sub-portion R24 and a fifth sub-portion R25. The pre-temporally aligned third portion 506 includes a first sub-portion R31, a second sub-portion R32, a third sub-portion R33, a fourth sub-portion R34 and a fifth sub-portion R35. The pre-temporally aligned fourth portion 508 includes a first sub-portion R41, a second sub-portion R42, a third sub-portion R43, a fourth sub-portion R44 and a fifth sub-portion R45. The pre-temporally aligned fifth portion 510 includes first a sub-portion R51, a second sub-portion R52, a third sub-portion R53, a fourth sub-portion R54 and a fifth sub-portion R55.

Each successive sub-portion after the first sub-portion, within a given portion, is moved and added to the first sub-portion of each subsequent sub-portion. For example, the first sub-portion R11 of pre-temporally aligned first portion 502 is added to sub-portion A1 of a temporally aligned first portion 512. The second sub-portion R12 of pre-temporally aligned first portion 502 is moved and added to the first sub-portion A2 of a temporally aligned second portion 514. The third sub-portion R13 of pre-temporally aligned first portion 502 is moved and added to the first sub-portion A3 of a temporally aligned third portion 516. The fourth sub-portion R14 of pre-temporally aligned first portion 502 is moved and added to the first sub-portion A4 of a temporally aligned fourth portion 518. The fifth sub-portion R15 of pre-temporally aligned first portion 502 is moved and added to the first sub-portion A5 of a temporally aligned fifth portion 520. The first sub-portion R21 of pre-temporally aligned second portion 504 is added to sub-portion A2 of the temporally aligned second portion 514. The second sub-portion R22 of pre-temporally aligned second portion 504 is moved and added to the first sub-portion A3 of a temporally aligned third portion 516. The third sub-portion R23 of pre-temporally aligned second portion 504 is moved and added to the first sub-portion A4 of a temporally aligned fourth portion 518. The fourth sub-portion R24 of pre-temporally aligned second portion 504 is moved and added to the first sub-portion A5 of a temporally aligned fifth portion 520. The first sub-portion R31 of pre-temporally aligned third portion 506 is added to sub-portion A3 of the temporally aligned third portion 516. The second sub-portion R32 of pre-temporally aligned third portion 506 is moved and added to the first sub-portion A4 of a temporally aligned fourth portion 518. The third sub-portion R33 of pre-temporally aligned third portion 506 is moved and added to the first sub-portion A5 of a temporally aligned fifth portion 520. The first sub-portion R41 of pre-temporally aligned fourth portion 508 is added to sub-portion A4 of the temporally aligned fourth portion 518. The second sub-portion R42 of pre-temporally aligned fourth portion 508 is moved and added to the first sub-portion A5 of a temporally aligned fifth portion 520. The first sub-portion R51 of pre-temporally aligned fifth portion 510 is added to sub-portion A5 of the temporally aligned fifth portion 520. The fifth sub-portion R25 of the pre-temporally aligned second portion 504, the fourth sub-portion R34 and fifth sub-portion R35 of pre-temporally aligned third portion 506, the third sub-portion R43, the fourth sub-portion R44, and fifth sub-portion R45 of pre-temporally aligned fourth portion 508, and the second sub-portion R52, the third sub-portion R53, the fourth sub-portion R54, and the fifth sub-portion R55 of pre-temporally aligned fifth portion 510 are moved to other portions in a similar pattern.

FIG. 5 is illustrative and shows a partial view of typical temporally aligning successive portions with pitch transposition factor of 5. As stated in a previous paragraph, this is a specific example of the general method that each successive sub-portion after the first sub-portion, within a given portion, is moved and added to the first sub-portion of each subsequent sub-portion. The general method illustrates one scheme for temporally aligning successive portions; other schemes are possible.

FIG. 6 discloses a block diagram of an audio reverberation apparatus 600 in accordance with principles of the invention. An analog audio signal 602 is received by the audio reverberation apparatus 600 through a connector 604 into a first preamplifier 606. The connector 604 illustrated in FIG. 6 is a female XLR connector. Other connectors can be used, for example, tip-ring-sleeve (TRS) phone receptacles, tip-sleeve (TS) phone receptacles, and phono connectors. The choice for the connector 604, is not limited to the above examples, any suitable connector can be used as long as it is suitable for receiving an analog audio signal.

A first ADC 608 receives a modified analog signal 610 from the first preamplifier 606. The first preamplifier 606 modifies the signal level of analog audio signal 602 according to the signal level range of the first ADC 608 and the expected signal level range of the analog audio signal 602. The first preamplifier 606 also buffers the analog audio signal 602 in order to present a low impedance output from the first preamplifier 606 to the first ADC 608. In addition, the first preamplifier 606 can include a filter that band limits the analog audio signal 602 in accordance with requirements of the first ADC 608. The choice of parameters and features of the preamplifier is in accordance with the requirements of the first ADC 608 and the signal level range of the analog audio signal. Optionally, the first preamplifier 606 or features of the first preamplifier 606 are integrated within the first ADC 608.

A processor 612 receives a first digital audio signal 614 that results from the analog to digital conversion within the first ADC 608. The processor 612 can alternatively be a microcontroller, a microprocessor, digital signal processor (DSP), field programmable logic array (FPGA), programmable logic device (PLD), gate array, application specific integrated circuit (ASIC), or any processing device that is capable of processing digital audio signals in a manner described for the processor 612 of this disclosure.

The processor 612 transposes the pitch of the first digital audio signal 614 upward by a multiplier or factor, for example, a factor of 10, or a factor of 500. Typical audio signals have a frequency range between 20 Hz to 20 kHz. Pitch transposing upward the first digital audio signal 614 by a factor of 10 would transpose a 20 Hz signal to 200 Hz and a 20 kHz signal to 200 kHz, making the pitch-transposed audio frequency range. Similarly, pitch transposing upward by a factor of 500 would transpose a 20 Hz signal to 10 kHz and transpose a 20 kHz signal to 1 MHz, making the making the pitch-transposed audio frequency range from 10 kHz to 1 MHz. The pitch transposition factor can typically range from 2 to 500, but is not limited to this range.

A first DAC 616 receives a pitch-transposed signal 618 from the processor 612 and converts to the pitch-transposed signal 618 into an analog signal 620. An amplification circuit 622 can include any required filtering or buffering after the first DAC 616. The amplification circuit 622 can also include a circuit capable of providing power to an acoustic driver 624. The acoustic driver 624 can be a transducer or combination of transducers responsive to a pitch transposed frequency range of the pitch-transposed signal 618. For example, for a pitch transposition factor of 5, the acoustic driver 624 could be an audio mid-range driver in combination with an electrostatic speaker capable of delivering both audio and ultrasonic frequencies. For a pitch transposition factor of 500, the acoustic driver 624 could be an electrostatic speaker capable of delivering both sonic and ultrasonic frequencies in combination with a piezoelectric element. Alternatively, acoustic drivers that use capacitive actuation, or magneto-restriction could also be used.

The acoustic driver 624 is coupled to a reverberation element 626 and it vibrates a reverberant medium 628. The reverberant medium 628 can be solid, liquid, or gas. For example, the reverberation element 626 may be a "plate reverb". A plate reverb includes a reverberant medium 628 in the form of a suspended plate or sheet. The plate is typically made of ceramic or metal, but may be any material suitable for simulating a reverberant field. The reverberation element 626 may be a "spring reverb". A spring reverb includes a reverberant medium 628 in the form of suspended springs. The reverberation element may be a "reverb chamber". A reverb chamber includes a reverberant medium 628 in the form of a gas such as air, or a liquid, such as water, in an enclosed cavity.

The acoustic driver 624 is shown located near a central portion of the reverberant medium 628. A first acoustic transducer 630 is shown located near one end of the reverberant medium 628 and a second acoustic transducer 632 is located at the opposite end with respect to the acoustic driver 624 of the reverberant medium 628. This arrangement is illustrative; other arrangements that are capable of producing a desirable reverberant field. For example, the acoustic driver 624 can be located near one end of the reverberant medium 628 with the first acoustic transducer 630 located near the opposite end.

The first acoustic transducer 630 receives sonic and/or ultra-sonic reverberation. The reverberation is a result the mechanical vibration generated by the acoustic driver 624 propagating through the reverberant medium 628. Similarly, the second acoustic transducer 632 receives sonic or ultrasonic reverberation. The first acoustic transducer 630 produces an electrical signal corresponding to the reverberation it senses. This signal is amplified by a second preamplifier 634 and the amplified signal is received by a second ADC 636. Similarly, the second acoustic transducer 632 produces a signal corresponding to the reverberation it senses. This signal is amplified by a third preamplifier 638 and the amplified signal is received by a third ADC 640.

The resulting digital signals from the second ADC 636 and third ADC 640 are received by the processor 612. The processor 612 pitch transposes downward the digital audio signal as well optionally temporally arranges selected samples of the digital signals in a manner similar as described in either for FIG. 3A, 3B, 3C, 3D, 4A, 4B, 4C, or 5. The digital audio signal is transposed reciprocally as the original pitch transposition. In other words, the pitch is transposed downward by the same factor as applied for upward pitch transposition so that the original audio frequencies are restored in a resulting digital audio signal 642. The process and apparatus described in FIG. 6 creates an audio frequency reverberation using a much smaller reverberation element with comparable frequency response and reverberant characteristics than one that would have been used if the herein described process and apparatus where not applied.

The resulting digital audio signal 642 is received by a second DAC 644. The second DAC 644 creates an analog audio signal 646. The analog audio signal 646 is buffered and filtered by an output driver 648. The output driver, for example, can be an operational amplifier circuit; those skilled in the art will readily recognize other equivalents. The output driver 648 is coupled to an output connector 650. The corresponding output audio signal 652 can be connected to an external audio device such as an audio mixing console. The output connector 650 illustrated in FIG. 6 is a male XLR connector. Other connectors can be used, for example, tip-ring-sleeve (TRS) phone receptacles, tip-sleeve (TS) phone receptacles, mini-phone receptacles, and phono connectors. The choice for the output connector 650, is not limited to the above examples, any suitable connector can be used as long as it is suitable for sending an analog audio signal.

It should also be understood that while the first ADC 608 and the second DAC 644 have been described as separate devices, it might be possible that they are contained within an integrated circuit package, for example, a codec 654. Similarly, the first DAC 616, second ADC 636, and third ADC 640 may also be located with a codec. Alternatively, all or some of the described ADCs and DACs can be located within the processor 612.

It may also be desirable to receive the input audio signal and second the corresponding reverberation output signal digitally. This can be accomplished through wireless or wired protocols. Suitable wireless protocols include but are not limited to through a protocol such as 802.11, 802.15, or Zigbee. Suitable wired protocol include computer protocols such as Universal Serial Bus (USB), FireWire, Thunderbolt, Ethernet, or digital audio protocols such as Multi-Channel Digital Audio Interface (MADI), AES3, or Sony Phillips Digital Interface (SPDIF).

FIG. 6 further illustrates transmission and reception hardware typical for Wireless transmission and reception as well USB, FireWire, or Ethernet. A wireless signal carries digital audio data that is received by and also digital reverberation data transmitted from the audio reverberation apparatus 600 through a wireless controller 656, and a wireless antenna 658. While the wireless controller 656 is shown as separate device from the processor 612, these can be combined into one integrated circuit.

In one aspect, the processor sends and receives digital audio data through a digital protocol processor 660, a transmitting/receiving driver 662, and a connector 664. A digital computer signal 667 carriers that signal to and from an external device adapted to transmit and receive that particular protocol of the digital computer signal 667. The protocol can be determined by the digital protocol controller 660. For example, the digital protocol controller 660, can be a USB peripheral controller, Thunderbolt controller, or Ethernet controller. While the digital protocol controller 660 and transmitting/receiving driver 662 are shown as separate devices, these can be combined into one integrated circuit. Similarly, both the digital protocol controller 660 and transmitting/receiving driver 662 can be built into the processor 612.

The digital audio data received by the audio reverberation apparatus 600 though either the wireless controller 656 or the digital protocol controller 660 is processed by the DSP in a similar manner as how first digital audio signal 614 is processed. Similarly, the digital audio data sent by the audio reverberation apparatus 600 to either the wireless controller 656 or digital protocol controller 660, corresponds to the digital audio signal 642 processed in a previously described manner.

While several means for receiving and transmitting audio signals into and out of the audio reverberation apparatus 600 have been described, the disclosed combination of means for receiving and transmitting audio signals into and out of the audio reverberation device 600 is illustrative. It is not the inventor's intent to require any particular means or combination of means.

FIG. 7A shows a personal computer for the upward and downward pitch transposing in communication with an enclosed apparatus 700. The apparatus includes a reverberation element, means for applying a resultant pitch-transposed audio signal to the acoustic reverberation element, and means for receiving a resultant reverberant signal from the acoustic reverberation element. FIG. 7B shows a block diagram of the enclosed apparatus 700 of FIG. 7A.

Referring to FIG. 7A, the enclosed apparatus 700 includes an enclosure 702. Illustrated is a rack mount enclosure compatible with a standard 19-inch equipment rack. This is one example of many possible enclosures, and is shown for illustrative purposes. Any enclosure that provides suitable acoustic isolation for a reverberation element and protection of the electronic circuitry within the enclosure can be used.

A personal computer 704 executes software code in one aspect, to provide upward pitch transposing of the audio signal and reciprocal downward pitch transposing of the resultant reverberant signal. In another aspect, the personal computer 704 executes software code to separate the audio signal into a plurality of portions before pitch transition and to temporally arrange resultant reverberant portions.

The personal computer can be a desktop, laptop, notebook computer, mobile computing device, tablet, pad, or any computing device capable of executing pitch transposition algorithms in accordance with principles of the invention. The audio signal source on the computer may be a storage device or memory on the personal computer 704 or may be a signal streamed into the personal computer 704. For example, a signal streamed over the internet or through either a wired or wireless port on the computer. The pitch-transposed audio signal is transmitted from a port 706 on the personal computer 704 and through signal cable 708 to port 710 on the enclosed apparatus 700. The port can be USB, FireWire, Thuderbolt, Ethernet, or any equivalent digital computer port cable using a digital computer protocol capable of transmitting and receiving real-time audio data. Alternatively, the personal computer 704 and the enclosed apparatus 700 can communicate the pitch-transposed audio signal through wireless communication. This includes 802.11, 802.15, BlueTooth, wireless USB or other wireless communication systems capable of transmitting and receiving real-time audio data.

Referring to FIGS. 7A and 7B, port 710 receives the upwardly pitch-transposed audio signal using digital protocol such as, but not limited to, USB, FireWire, Thunderbolt, or Ethernet. A protocol-processing device 712 transfers the upwardly pitch-transposed audio signal to a processor 714. The processor 714 can be a microcontroller, microprocessor, DSP, FPGA, PLD, gate array, or ASIC. While shown separately, the processor 714 and the protocol-processing device 712 may be combined into one integrated circuit.

A DAC 716 receives the pitch-transposed signal from the processor 612 and converts the pitch-transposed signal into an analog signal 718. An amplification circuit 720 includes any filtering or buffering required after the DAC 716 and a driver capable of providing power to an acoustic driver 722. The acoustic driver 722 can be a transducer or combination of transducers responsive to the pitch-transposed audio frequency range. For example, for a pitch transpose factor of 5, the acoustic driver 722 could be an audio mid-range driver in combination with an electrostatic speaker capable of delivering both audio and ultrasonic frequencies. For a pitch transpose factor of 500, the acoustic driver 722 could be an electrostatic speaker capable of delivering both sonic and ultrasonic frequencies in combination with a piezoelectric element. Alternatively, acoustic drivers that use capacitive actuation, or magneto-restriction could also be used.

The acoustic driver 722 vibrates a reverberation element 724. The reverberation element can include a solid, liquid, or gas reverberant medium. For example, the reverberation element 724 may be a plate reverb, a spring reverb, or a reverb chamber. These elements have been previous previously described.

The acoustic driver 722 is shown located near one end of the reverberation element 724. An acoustic transducer 726 is shown located near the opposite end of the reverberation element 724 with respect to the acoustic driver 722. This arrangement is illustrative of a monophonic reverberation; other arrangements are capable of producing a desirable reverberant field. For example, stereo arrangements or surround sound arrangements using one or more acoustic drivers and a plurality of acoustic transducers.

The acoustic transducer 726 receives sonic and/or ultrasonic reverberation. The reverberation is a result the mechanical vibration generated by the acoustic driver 722 propagating through the reverberant medium of the reverberation element 724. The acoustic transducer 726 produces an electrical signal corresponding to the reverberation it senses. This signal is amplified by a preamplifier 728 and the amplified signal is received by an ADC 730. The resulting digital reverberation signal from the ADC 730 is received by the processor 714. The protocol-processing device 712 receives the digital reverberation signal and processes it into digital computer protocol for transmission to the personal computer 704 through port 710.

This block diagram shows the ADC 730 and the DAC 716 corresponding to a monophonic configuration. This is meant to show one possible configuration. Other configurations are possible using multiple acoustic drivers, multiple transducers, multiple ADCs and multiple DACs. In addition, those skilled in the art will readily recognize that either single or multiple ADCs and/or DACs can be combined into a single integrated circuit or may be integrated into the processor 714.

FIG. 8 shows the reverberation element 626 of FIG. 6 as a spring reverberation device 802 using a plurality of springs as a reverberant medium. The spring reverberation device 802 includes the acoustic driver 624 driven with a pitch-transposed audio signal in accordance with FIG. 6. The acoustic driver 624 is coupled to a suspended mounting plate 804. A plurality of springs 806 are coupled on one end to the suspended mounting plate 804 and on the other end to a suspended frame 808. The suspended frame 808 is coupled to outer frame 810 of the spring reverberation device 802 through a plurality of acoustic dampeners 812. A first transducer 814, second transducer 816, third transducer 818, and forth transducer 820 are mounted at different positions on the suspended frame 808 in order to simulate a three dimensional sound field. These transducers serve an equivalent function to the first acoustic transducer 630 and the second acoustic transducer 632 of FIG. 6 and their corresponding signals are processed by the processor 612 as described for the signals from the first acoustic transducer 630 and the second acoustic transducer 632 of FIG. 6.

FIG. 9 shows a spring reverberation device 902 similarly configured as the spring reverberation device 802 of FIG. 8, expect the outer frame 904 and suspended frame 906 are circular instead of rectangular. The plurality of springs 908 are now equal length and will create a sound field with a distinctly different reverberant field than the spring reverberation device 802 of FIG. 8. The spring reverberation device 902 includes the acoustic driver 624 driven with a pitch-transposed audio signal in accordance with FIG. 6. The acoustic driver 624 is coupled to a suspended mounting plate 910. The plurality of springs 908 are coupled on one end to the suspended mounting plate 910 and on the other end to the suspended frame 906. The suspended frame 906 is coupled to outer frame 904 of the spring reverberation device 902 through the plurality of acoustic dampeners 912. The first transducer 914, second transducer 916, third transducer 918, and forth transducer are mounted around the suspended frame 906. These transducers serve an equivalent function to the first acoustic transducer 630 and the second acoustic transducer 632 of FIG. 6. Their corresponding signals are processed by the processor 612, as described for the signals from the first acoustic transducer 630, and the second acoustic transducer 632 of FIG. 6.

FIG. 8 and FIG. 9 are examples of spring reverbs that can be used as an acoustic reverberation element. It is not the intent of the inventor to make these limiting to the meaning of spring reverb. Indeed, any spring reverb appropriately responsive to pitch-transposed audio signal can be used as the acoustic reverberation element. For example, a simple linear spring reverb device with either a single spring or a plurality of springs.

FIG. 10 illustrates a typical plate reverb 1000 that can be used as the acoustic reverberation element. In FIG. 10, the plate reverb can include a sheet, foil, or plate 1002. The plate 1002 can be made of any material with a frequency response capable with the upward pitch-transposed signal in order to create the desired reverberation effect by mechanical vibration of the plate. Depending on the desired frequency response, plate materials can include steel, aluminum, ceramics, or any other material capable of transmitting the pitch transposed sound. The plate 1002 is mounted to a frame 1004 by suspended by a plurality of acoustic isolation elements 1006 such as springs, wires, or other suitable device for dampening acoustic transmission from the frame 1004 to the plate 1002.

An acoustic driver 1008, such as the acoustic driver 624 of FIG. 6 or acoustic driver 722 of FIG. 7B creates an acoustic signal that mechanically vibrates the plate 1002. The acoustic driver has a suitable frequency response for reproducing the pitch-transposed signal. A first acoustic transducer 1010 and a second acoustic transducer 1012 receive reverberation is a result the mechanical vibration generated by the acoustic driver 1008 propagating through the plate 1002. The first acoustic transducer 1010 and the second acoustic transducer 1012 serve an equivalent function to the first acoustic transducer 630 and the second acoustic transducer 632 of FIG. 6. Similarly, they perform an equivalent function as the acoustic transducer 726 of FIG. 7.

The acoustic driver is illustrated as a single unit but in fact, depending on the required frequency response, may be a composite of several acoustic drivers. For example, for a pitch transposition factor of 5, the acoustic driver 1008 could be an audio mid-range driver in combination with an electrostatic speaker capable of delivering both audio and ultrasonic frequencies. For a pitch transposition factor of 500, the acoustic driver 1008 could be an electrostatic speaker capable of delivering both sonic and ultrasonic frequencies in combination with a piezoelectric element. Alternatively, acoustic drivers that use capacitive actuation, or magneto-restriction could also be used.

While the plate is illustrated as rectangular in shape and having one acoustic driver and two acoustic transducers, other configurations are possible. For example, one acoustic driver and one acoustic transducer can be mounted at opposite ends of the plate 1002 for a monophonic reverberation effect. Similarly, a plurality of acoustic drivers and a plurality of acoustic transducers can be used to create surround sound effects.

FIG. 11 shows a partial cutaway view of an enclosed apparatus 1100 that includes a reverb chamber 1102 suitable as acoustic reverberation element. The enclosed apparatus 1100 includes an enclosure 1104. The enclosure top surface 1106 is shown in partial cutaway view. The reverb chamber 1102 is enclosed in order to help isolate it from outside acoustic interference. The reverb chamber 1102 may include additional sound isolation measures. For example, the reverb chamber 1102 may include an enclosed inner portion that is partially acoustically isolated from the enclosure 1104. This isolation may be accomplished by surrounding the enclosed inner portion with sound isolation material such as foam or fiberglass insulation. Alternatively, the enclosed inner portion may be isolated by suspending it from the enclosure 1104 by spring dampeners. In another aspect, acoustic isolation may be accomplished by configuring the reverb chamber 1102 portion of the enclosure with several layers that include a isolation layer made of sound damping material between the enclosure 1104 outer layer and the inner layer of the reverb chamber 1102.

The enclosure 1104 can include an electronics portion 1108. The electronics portion 1108 in one aspect can include electronic circuitry 1110 similar to FIG. 6 where the electronics performs the upward and reciprocal downward pitch transposition. Referring to FIGS. 7 and 11, in another aspect, the electronic portion can also include electronic circuitry similar to FIG. 7 where the electronic circuitry 1110 is adapted to receive upwardly pitch-transposed signals from a personal computer 704 and send a resultant reverberation signal back to the personal computer 704 for downward pitch transposition. Communication with the personal computer 704 can be facilitated by wired communication such as an Ethernet port 1112 or a USB port 1114. As previously discussed, other forms of both wired and wireless communication with the personal computer 704 are possible.

The reverb chamber, as shown in FIG. 11, includes a first acoustic driver 1116 and a second acoustic driver 1118 for transmitting sound through the acoustic medium. The acoustic medium is typically air, however, in some applications other gases may be a desirable acoustic medium because of their sound transmissive characteristics. The resultant reverberant field is received by a first acoustic transducer 1120 and a second acoustic transducer 1122. As previously described, the acoustic drivers, although shown as drivers within a single housing, may be composite drivers in order to provide a frequency response suitable for creating a desired reverberation effect from the pitch-transposed audio signal within the reverb chamber 1102.

One of the advantages of the exemplary methods and apparatus described is to provide a compact electro-acoustic reverberation device where the acoustic reverberation element can be smaller in dimension than electro-acoustic reverberation elements without the herein described methods or apparatus. For example, a typical plate reverberation device can have dimensions as large as 1 m×3 m. Applying the herein described methods or apparatus, the length and width of the plate reverb device can be reduced by the pitch transposition factor. For example, with a pitch transposition factor of 10, the length and width of the plate can be as small as 0.1 m×0.3 m and achieve a similar reverb characteristic as the plate of larger dimension. For an apparatus or method described herein applied to a reverb chamber, a pitch transposition factor of 100 to 500, for example, can allow a relatively small chamber simulate the reverb characteristic of a chamber or room with dimensions of 100 to 500 times larger.

Accordingly, an audio reverberation apparatus with the herein presented objectives has been described. It is not the intent of the inventor to limit the claimed invention to the examples, variations, and exemplary embodiments described in the specification. Those skilled in the art will recognize that variations will occur when embodying the claimed invention in specific implementations and environments. For example, it is possible to implement certain features described in separate embodiments in combination within a single embodiment. Similarly, it is possible to implement certain features described in single embodiments either separately or in combination in multiple embodiments. It is the intent of the inventor that these variations fall within the scope of the claimed invention. While the examples, exemplary embodiments, and variations are helpful to those skilled in the art in understanding the claimed invention, it should be understood that, the scope of the claimed invention is defined by the following claims and equivalents thereof.

What is claimed is:

1. An apparatus used for processing audio signals into and out of an acoustic reverberation element, comprising:
  a processor configured to upwardly pitch transpose an audio signal by a factor, resulting in pitch-transposed audio signal;
  means for applying the pitch-transposed audio signal to the acoustic reverberation element;

means for receiving a resultant reverberant signal from the acoustic reverberation element; and the processor configured to downwardly pitch transposing the reverberant signal by the factor.

2. The apparatus of claim 1, wherein means for applying the resultant pitch-transposed audio signal and means for receiving the resultant reverberant signal includes wireless communication.

3. The apparatus of claim 1, wherein means for applying the resultant pitch-transposed audio signal and means for receiving the resultant reverberant signal includes a digital computer protocol.

4. The apparatus of claim 1, further including:
an enclosure; and
within the enclosure includes the processor, means for receiving a resultant reverberant signal from the acoustic reverberation element, and means for downwardly pitch transposing the reverberant signal by the factor.

5. The apparatus of claim 1, further including the acoustic reverberation element.

6. The apparatus of claim 5, wherein the acoustic reverberation element is a plate reverb.

7. The apparatus of claim 5, wherein the acoustic reverberation element is a spring reverb.

8. The apparatus of claim 5, wherein the acoustic reverberation element is a reverb chamber.

9. The apparatus of claim 1, further including:
an enclosure; and
within the enclosure includes the reverberation element, the processor, means for receiving a resultant reverberant signal from the acoustic reverberation element, and means for downwardly pitch transposing the reverberant signal by the factor.

10. An apparatus used for processing audio signals into and out of an acoustic reverberation element, comprising:
a processor configured to separate an audio signal into portions and upwardly pitch transposing the audio signal by a factor, resulting in a plurality of pitch-transposed portions;
means for applying the plurality of pitch-transposed portion to the acoustic reverberation element;
means for receiving a plurality of resultant reverberant portions from the acoustic reverberation element; and
the processor configured to temporally arrange successive reverberant portions, and downwardly pitch transposing temporally arranged reverberant portions by the factor.

11. The apparatus of claim 10, wherein means for applying the resultant pitch-transposed audio signal and means for receiving the plurality of resultant reverberant portions includes wireless communication.

12. The apparatus of claim 10, wherein means for applying the resultant pitch-transposed audio signal and means for receiving the plurality of resultant reverberant portions includes a digital computer protocol.

13. The apparatus of claim 10, wherein the acoustic reverberation element is a plate reverb.

14. The apparatus of claim 10, wherein the acoustic reverberation element is a spring reverb.

15. The apparatus of claim 10, wherein the acoustic reverberation element is a reverb chamber.

16. A non-transitory software program product in which a software code is stored, said software code realizing the following when executed by a processing device:
upwardly pitch transposing by a factor an audio signal;
applying a resultant pitch-transposed audio signal to an acoustic reverberation element;
receiving a resultant reverberant signal from the acoustic reverberation element; and
downwardly pitch transposing the reverberant signal by the factor.

17. A non-transitory software program product in which a software code is stored, said software code realizing the following when executed by a processing device:
separating an audio signal into portions and upwardly pitch transposing the audio signal by a factor, resulting in a plurality of pitch-transposed portions;
applying the plurality of pitch-transposed portions to an acoustic reverberation element;
receiving a plurality of resultant reverberant portion from the acoustic reverberation element; and
temporally arranging successive reverberant portions, and downwardly pitch transposing temporally arranged reverberant portions by the factor.

18. A method for processing audio signals into and out of an acoustic reverberation element, comprising:
upwardly pitch transposing an audio signal by a factor;
applying a resultant pitch-transposed audio signal to the acoustic reverberation element;
receiving a resultant reverberant signal from the acoustic reverberation element; and
downwardly pitch transposing the reverberant signal by the factor.

19. A method for processing audio signals into and out of an acoustic reverberation element, comprising:
separating an audio signal into portions and upwardly pitch transposing the audio signal by a factor, resulting in a plurality of pitch-transposed portions;
applying the plurality of pitch-transposed portions to the acoustic reverberation element;
receiving a plurality of resultant reverberant portion from the acoustic reverberation element; and
temporally arranging successive reverberant portions, and downwardly pitch transposing temporally arranged reverberant portions by the factor.

* * * * *